United States Patent [19]

Monticelli et al.

[11] Patent Number: 4,791,383

[45] Date of Patent: Dec. 13, 1988

[54] HIGH SPEED CURRENT AMPLIFIER BUFFER CIRCUIT

[75] Inventors: Dennis M. Monticelli, Fremont; John W. Wright, Los Altos, both of Calif.

[73] Assignee: National Semiconductor Corporation, Santa Clara, Calif.

[21] Appl. No.: 92,929

[22] Filed: Sep. 4, 1987

[51] Int. Cl.[4] .............................................. H03F 3/30
[52] U.S. Cl. ..................................... 330/265; 330/156
[58] Field of Search ................ 330/156, 263, 265, 267

[56] References Cited

U.S. PATENT DOCUMENTS 4,500,849 2/1985 Nakayama ....................... 330/156 X Primary Examiner—James B. Mullins
Attorney, Agent, or Firm—Gail W. Woodward; Lee Patch; Mark Aaker

[57] ABSTRACT

A high speed buffer circuit is composed of complementary symmetry emitter follower driver and output stages. The input of driver stage includes active load devices cross-coupled to the output stage inputs so that the output stage is bootstrap driven from emitter followers. The circuit is biased by level shifting means to operate as a class AB current amplifier. It displays a wide bandwidth along with a high slew rate and can source or sink a large pulsed current.

7 Claims, 2 Drawing Sheets

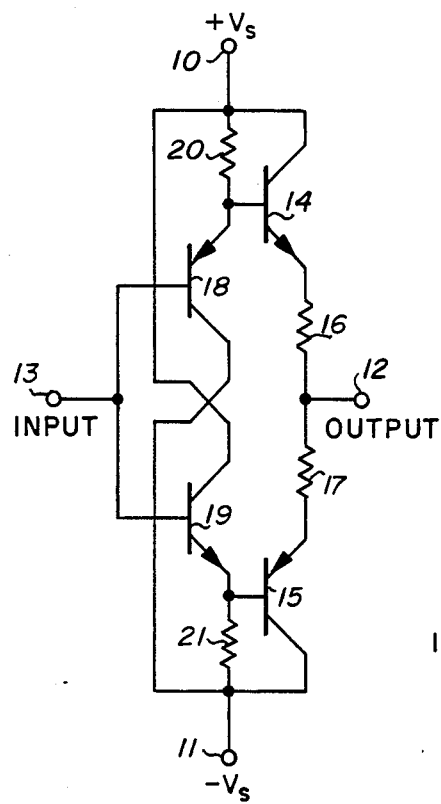
*Fig_1* (PRIOR ART)
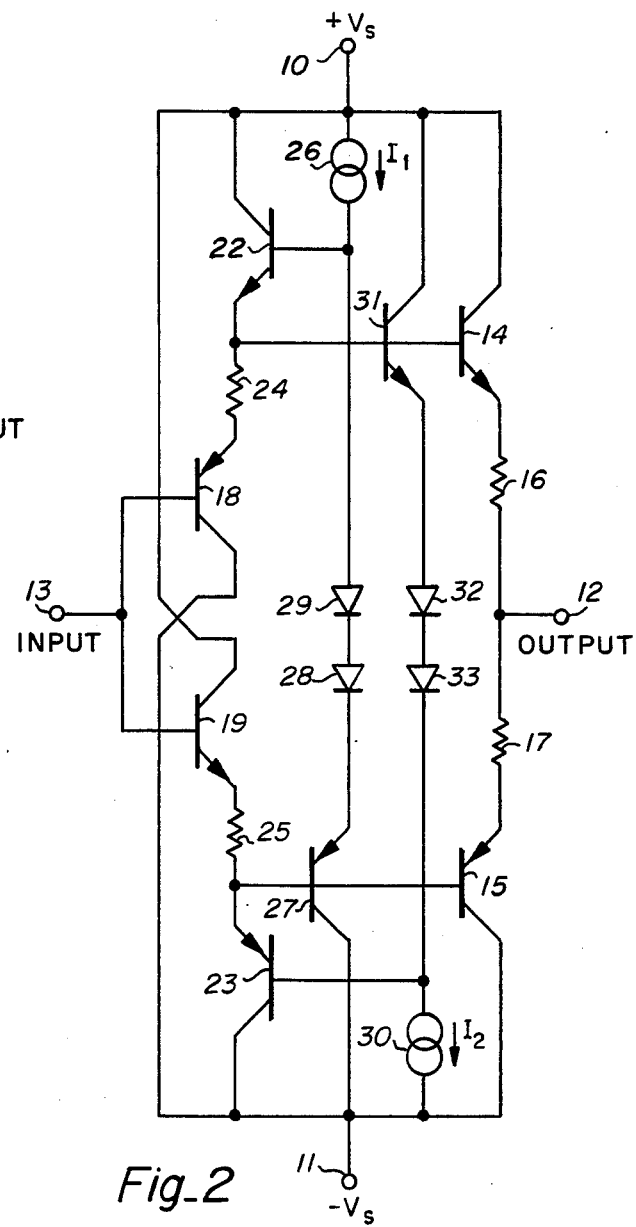
*Fig_2*

HIGH SPEED CURRENT AMPLIFIER BUFFER CIRCUIT

BACKGROUND OF THE INVENTION

Buffers are often called voltage followers because they have substantially unity voltage gain. They are basically current amplifiers that have a low output impedance and a high input inpedance. Their output voltage swing approaches the operating supply voltage and they typically have large slew rates and wide bandwidths. The basic transistor emitter follower is a classical buffer.

From an applications standpoint buffers serve as signal isolation devices, line drivers and signal sources. They are often used in combination with an operational amplifier (op amp) where the buffer is used to isolate the op amp from its load.

The LH0002 is an industry standard buffer, the characteristics of which will be described in some detail hereinafter. Other standard buffers are the LH0033 and LH0063 family which is known for its very high input resistance and for its high speed and very high slew rate. All of these devices employ hybrid construction in their manufacture.

SUMMARY OF THE INVENTION

It is an object of the invention to provide a buffer circuit that operates at high speed, drives a 50-ohm load, and can be manufactured using monolithic integrated circuit (IC) construction.

It is a further object of the invention to provide a unity gain high speed buffer circuit that can operate at low quiescent current.

These and other objects are achieved in a circuit configured as follows. The output stage is composed of a complementary pair of emitter follower transistors operate in class AB. These emitter followers are driven from a complementary pair of emitter follower transistors biased to operate as class AB drivers. Such a combination of cascaded emitter followers will produce close to unity voltage gain. Such a configuration displays mirror symmetry in that the top half of the circuit is a complememtary mirror image of the bottom half. For example, when the top half of the circuit uses PNP transistors the bottom half employs NPN's. Each of the bases of the output stage transistors is returned to its collector supply by way of an active load transistor whch is connected as an emitter follower to drive the base from a signal obtained from the mirror symmetry opposite half of the circuit. Thus, the active load devices have their inputs cross-coupled to the input transistors and effectively bootstrap the output transistor drive. This means that the output transistor base capacitances are both charged and discharged through active transistors and the circuit is thereby speeded in its signal drive operation.

BRIEF DESCRIPTION OF THE DRAWING

FIG. 1 is a schematic diagram of a prior art circuit.

FIG. 2 is a schematic diagram of the circuit of the invention.

DESCRIPTION OF THE PRIOR ART

Figure 4:
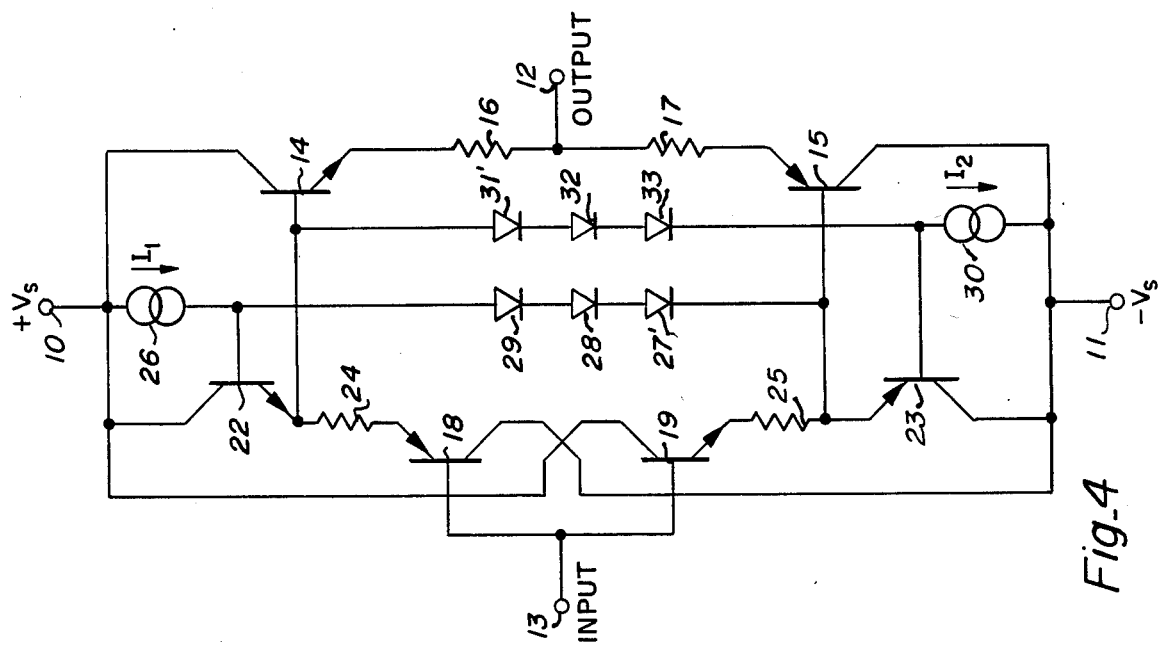
FIGS. 3 and 4 are schematic diagrams of alternative embodiments of the circuit of the invention.

FIG. 1 shows. the prior art buffer known commercially as the LH0002. Power is applied as $V_S$ between +terminal 10 and −terminal 11. The output at terminal 12 is a reproduction of the input signal at terminal 13. Typically, such a circuit has an unloaded voltage gain of 0.97 which is substantially unity. The typical current gain is about 40,000. Thus, the input impedance will be about 400K ohms when a 1K ohm load is used. A typical slew rate is 200 volts per microsecond and is load dependent.

Complementary transistors 14 and 15 form the output stage which is emitter follower connected. Low value resistors 16 and 17 couple the output transistor emitters to output terminal 12. Complementary input transistors 18 and 19 are connected as emitter followers directly coupled to drive the bases of transistors 14 and 15. Note that PNP transistor 18 drives NPN transistor 14 and NPN transistor 19 drives PNP transistor 15. Resistors 20 and 21 respectively act as load elements for transistors 18 and 19. These resistors also act to return the bases of transistors 14 and 15 to the supply terminals 10 and 11.

In operation the buffer is composed of cascaded emitter follower stages and complementary symmetry is employed to handle positive and negative inputs. Resistors 20 and 21 are selected to determine the circuit quiescent current. Typically, the LH0002 will draw about 6 ma from a ±12 volt supply with 1.5 mA flowing in 18 and 19 and 3 mA in 14 and 15. The circuit has an effective AB bias and can deliver a steady state output current of ±100 ma.

Output transistors 14 and 15 are made relatively large to provide the desired output current. Thus, the major frequency limitation is present at the bases of transistors 14 and 15. Transistor 14 is turned on by the current flowing in resistor 20 and is turned off by the current flowing in transistor 18. Since the value of resistor 20 is establshed by the circuit quiescent current it will limit the turn on current for transistor 14. Turn on could be improved by making resistor 20 smaller but this would increase quiescent current and input bias current. Thus, a compromise is required.

In terms of small signal operation, the above-described LH0002 will typically have a 30 MH$_Z$ bandwidth and a 7-nanosecond rise time when using a 50 ohm load and a 100 MV signal. The LH0002 is of hybrid construction primarily because the PNP transistors ordinarily employed in monolithic integrated circuits are poor in frequency performance.

It would be desirable to manufacture such a buffer in monolithic IC form and to provide a circuit in which the aboveidentified compromise is not required.

DESCRIPTION OF THE INVENTION

FIG. 2 is a schematic diagram of the circuit of the invention. Where the circuit elements are the same as the prior art (FIG. 1) the same numerals are used. It is to be understood that while hybrid IC construction can be used, monolithic IC construction can also be employed if desired. This is true provided that suitable monolithic PNP devices are present. Such devices are disclosed in copending application Ser. No. 853,530, filed Apr. 18, 1986. This application, by J. Barry Small and Matthew S. Buynoski, is titled A HIGH VOLTAGE COMPLEMENTARY NPN/PNP PROCESS and is assigned to the assignee of the present invention.

Large sized complementary output transistors 14 and 15 are coupled to output terminal 12 by low value resistors 16 and 17. Complementary emitter follower driver transistors 18 and 19 are driven from input terminal 13. Thus far, the circuit is similar to FIG. 1 and mirror symmetry is present.

Complementary transistors 22 and 23 are connected as active loads respectively for transistors 18 and 19. They are connected as emitter followers which are bootstrap driven by cross-coupling from the complementary or mirror image of the circuit. Low value resistors 24 and 25 have values selected to determine the circuit quiescent current and improve stability with capacitive loads.

Transistor 22 is biased from current source 26 which produces a current $I_1$ that flows in transistor 27 which is connected as an emitter follower. The base of transistor 27 is coupled to the emitter of active load transistor 23. Diodes 28 and 29 level shift the emitter of transistor 27 and directly couple it to the base of transistor 22. Thus, the base of transistor 22 is three diode drops above the emitter of transistor 23. Since the emitter of transistor 23 is operated at the $V_{BE}$ of transistor 19, plus the voltage drop across resistor 25, below input terminal 13, the base of transistor 22 is driven from the input terminal via transistor 19. Therefore, as the input terminal swings up and down in response to the input signal to modulate transistor 18, load transistor 22 is modulated so as to deliver whatever current is necessary for transistor 18 to follow the input. Thus, load transistor 22 is called active. This active load action will bootstrap the drive to the base of transistor 14.

Likewise, current sink 30 biases transistor 23 and produces current $I_2$ which flows in transistor 31. The base of transistor 31 is coupled to the emitter of transistor 18 via resistor 24 and the emitter of transistor 31 drives the base of transistor 23 to make it an active load for transistor 19. Diodes 32 and 33 level shift the output of emitter follower transistor 31 to set the operating level of transistor 23. Thus, the signal drive to the base of transistor 15 is bootstrapped as was that of transistor 14.

In terms of the output transistors 14 and 15 it can be seen that each one has its base charged and discharged by means of an active transistor that quiescently carries must less current than the amount needed to drive the output transistors quickly on and off under conditions of output loading. Thus, the the compromise required in the prior art circuit is avoided. Resistors 24 and 25 are relatively small value devices whose value is selected to determine the current flowing in transistors 18 and 19. This current value is normally made equal to the values of $I_1$ and $I_2$.

Such buffer circuits can perform as Class AB devices for small signal operation and the above-described operation is present. In this form of operation the conduction of transistors 14 and 15 will be modulated in push-pull. As the current in transistor 14 rises the current in transistor 15 falls and the difference will flow in the load (not shown) that is connected to terminal 12. Thus, the circuit can sink or source load current as a small signal amplifier using all the same transistors as for large signal. Because the circuit behaves similarly for small and large signal operation, and no transistors are switched in or out or turned on or off as a function of input signal level, distortion is low for this buffer configuration.

The circuit is capable of delivering a large output current to the load because current $I_1$ or $I_2$ are each multiplied by the current gain of two transistors not just one. Maximum output source current is delivered when terminal 12 is driven close to $+V_S$ at terminal 10 such that transistor 18 is turned off. This will turn transistor 19 on and pull the bases of transistors 15 and 27 up thereby turning them off. For this condition $I_1$ flows into the base of transistor 22 which will therefore act to pull the base of transistor 14 close to the positive supply rail. For this condition transistor 14 will source a very large current to terminal 12. If the input terminal is driven to the negative rail, the opposite action will occur. The circuit will sink a very large current from terminal 12. Convention current limiting circuitry (not shown) is employed to limit peak output current to about 300 MA independent of supply voltage. Large output current is very useful for driving 50 ohm and/or capacitive load.

Figure 3:
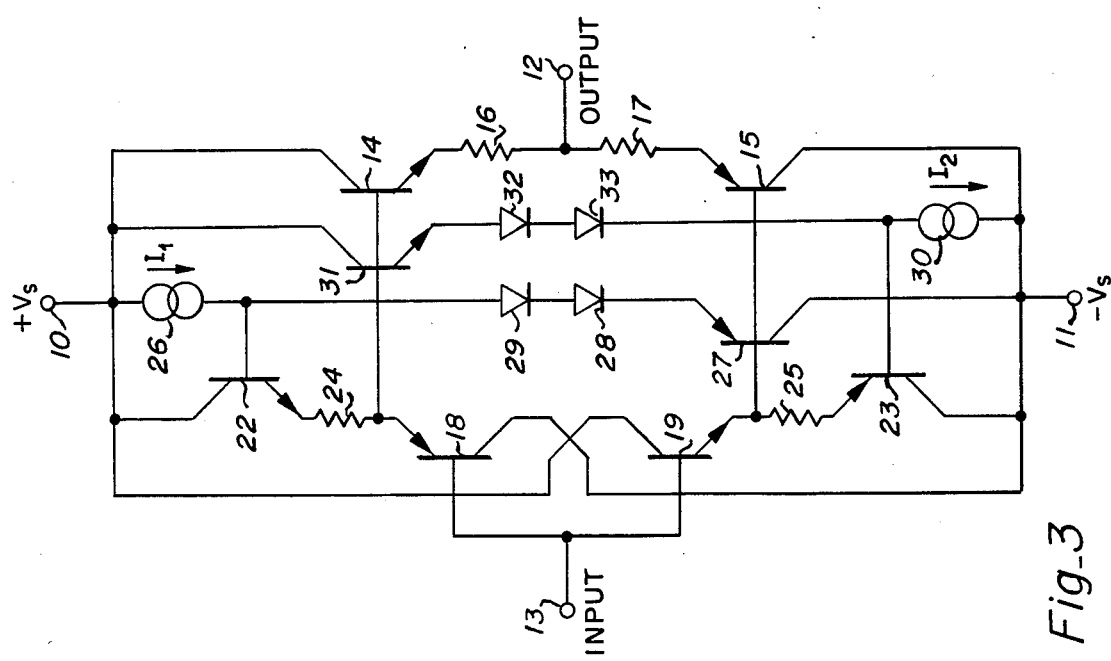

FIG. 3 shows an alternative circuit configuration that operates in much the same way as FIG. 2. The main difference is that the output transistors 14 and 15 are directly driven from the emitters of transistors 18 and 19 respectively. In FIG. 2 the action of resistors 24 and 25 will degenerate and slightly reduce the gain of the input transistor stage. In the FIG. 3 circuit the transconductance of transistors 18 and 19 is increased thereby increasing the small signal bandwidth of the circuit.

FIG. 4 is another alternative circuit. Here the emitter followers 27 and 31 of FIG. 2 have been replaced with diodes 27' and 31' which function respectively with diode pairs 28–29 and 32–33 to create the required level shifting. In this circuit version $I_2$ flows in transistor 22 which also conducts the current flowing in transistor 18. Conversely $I_1$ flows in transistor 23 which also conducts the current flowing in transistor 19. Otherwise, the circuit functions in a manner similar to that of FIG. 2.

EXAMPLE

The circuit of FIG. 2 was constructed in silicon, monolithic, junction-isolated IC form. The NPN and PNP transistors were fabricated as set forth in application Ser. No. 853,530 filed Apr. 18, 1986. Resistors 16 and 17 were two ohms each and resistors 24 and 25 were 100 ohms each. Constant current devices 26 and 30 were each set at 1.4 ma. When circuit was operated with a supply of ±5 volts it could drive a 6 volt (peak-to-peak) signal at 10 MH$_Z$ video into a 50-ohm load. The total harmonic distortion was less than 1% and the slew rate was 800 volts per microsecond. Using a ±10 volt supply it could deliver a pulsed output current of 300 ma. The circuit bandwidth was dc to 50 MH$_Z$. The device is available commercially as LM6121 and LM6125.

The circuit of the invention has been described, along with alternatives, and a working example detailed. When a person skilled in the art reads the foregoing description, other alternatives and equivalents, within the spirit and intent of the invention, will be apparent. Accordingly, it is intended that the scope of the invention be limited only by the following claims.

We claim:

1. A buffer amplifier circuit having input and output terminals and connectable between the positive and negative rails of an operating power supply, said circuit comprising:

a pair of complementary emitter follower output transistors having their outputs commonly coupled to said circuit output terminal and having their inputs driven in the same phase;

a pair of complementary emitter follower input transistors having their inputs commonly coupled to said circuit input terminal and their outputs coupled to drive the inputs of said pair of complementary emitter follower output transistors, said input transistors being arranged to be complementarily connected to said output transistors; and a pair of complementary bootstrap load transistors connected to said input transistors and having inputs cross-coupled to be driven from the inputs of said output transistors. sistors.

2. The circuit of claim 1 further including level shifting means coupled between said inputs of said bootstrap load transistors and said inputs of said output transistors.

3. The circuit of claim 2 wherein said level shifting means are constituted to bias said output transistors for class AB operation.

4. The circuit of claim 2 wherein said level shifting means are constituted to bias said input transistors for class AB operation.

5. The circuit of claim 1 wherein said output transistors have their emitters coupled to said output terminal by means of low value resistors.

6. The circuit of claim 1 wherein said input transistors include low value resistors coupled in series with their emitters thereby to determine the quiescent current in said circuit.

7. The circuit of claim 1 wherein said bootstrap load transistors are each biased from a separate current source and said level shifting means comprise forward biased diodes.

* * * * *